US011110895B2

(12) United States Patent
Maluf et al.

(10) Patent No.: US 11,110,895 B2
(45) Date of Patent: Sep. 7, 2021

(54) VEHICLE NETWORK INTRUSION DETECTION SYSTEM (IDS) USING VEHICLE STATE PREDICTIONS

(71) Applicant: Cisco Technology, Inc., San Jose, CA (US)

(72) Inventors: David A. Maluf, Mountain View, CA (US); Nancy Cam-Winget, Mountain View, CA (US); Andrew Michael McPhee, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 312 days.

(21) Appl. No.: 15/948,134

(22) Filed: Apr. 9, 2018

(65) Prior Publication Data
US 2019/0308589 A1    Oct. 10, 2019

(51) Int. Cl.
*B60R 25/34*    (2013.01)
*G06N 5/04*    (2006.01)
(Continued)

(52) U.S. Cl.
CPC .......... *B60R 25/34* (2013.01); *B60R 25/1004* (2013.01); *B60R 25/104* (2013.01);
(Continued)

(58) Field of Classification Search
CPC ... B60R 25/34; B60R 25/1004; B60R 25/104; B60R 2325/40; G06F 30/20; G06N 5/04; H04L 2012/40215
See application file for complete search history.

(56) References Cited

U.S. PATENT DOCUMENTS

| 9,358,924 B1 * | 6/2016 | Preston | G06F 30/15 |
| 9,428,013 B2 * | 8/2016 | Singh | B60C 11/246 |

(Continued)

FOREIGN PATENT DOCUMENTS

| CN | 106568449 A | | 4/2017 |
| CN | 109358344 A | * | 2/2019 |
| JP | 2017149358 A | | 8/2017 |

OTHER PUBLICATIONS

N.A.Thacker, A.J.Lacey, Tutorial: The Kalman Filter., Jan. 12, 1998, Imaging Science and Biomedical Engineering Division, Medical School, University of Manchester, Stopford Building, Oxford Road, Manchester, M13 9PT.*

(Continued)

*Primary Examiner* — Angelina Shudy
(74) *Attorney, Agent, or Firm* — Behmke Innovation Group LLC; Kenneth J. Heywood; James J. Wong

(57) ABSTRACT

In one embodiment, a processor of a vehicle predicts a state of the vehicle using a behavioral model. The model is configured to predict the state based in part on one or more state variables that are available from one or more sub-systems of the vehicle and indicative of one or more physical characteristics of the vehicle. The processor computes a representation of a difference between the predicted state of the vehicle and a measured state of the vehicle indicated by one or more state variables available from the one or more sub-systems of the vehicle. The processor detects a malicious intrusion of the vehicle based on the computed representation of the difference between the predicted and measured states of the vehicle exceeding a defined threshold. The processor initiates performance of a mitigation action for the detected intrusion, in response to detecting the malicious intrusion of the vehicle.

18 Claims, 9 Drawing Sheets

(51) Int. Cl.
*B60R 25/104* (2013.01)
*B60R 25/10* (2013.01)
*G06F 30/20* (2020.01)
*H04L 12/40* (2006.01)

(52) U.S. Cl.
CPC .............. *G06F 30/20* (2020.01); *G06N 5/04* (2013.01); *B60R 2325/40* (2013.01); *H04L 2012/40215* (2013.01)

(56) References Cited

U.S. PATENT DOCUMENTS

| | | | | |
|---|---|---|---|---|
| 9,910,980 | B2* | 3/2018 | Kolacinski | G06F 21/55 |
| 10,826,932 | B2* | 11/2020 | Abbaszadeh | G06N 20/00 |
| 2003/0060939 | A1* | 3/2003 | Jones | G05B 13/04 |
| | | | | 701/3 |
| 2004/0230833 | A1* | 11/2004 | McCallam | H04L 63/1416 |
| | | | | 726/25 |
| 2006/0103573 | A1* | 5/2006 | Geier | G01S 19/29 |
| | | | | 342/357.68 |
| 2006/0167784 | A1* | 7/2006 | Hoffberg | G06Q 50/188 |
| | | | | 705/37 |
| 2007/0271037 | A1* | 11/2007 | Overstreet | G01S 19/47 |
| | | | | 701/472 |
| 2014/0159925 | A1* | 6/2014 | Mimeault | G08G 1/0175 |
| | | | | 340/935 |
| 2014/0184120 | A1* | 7/2014 | Lingenfelser | H02P 6/183 |
| | | | | 318/400.33 |
| 2015/0271201 | A1* | 9/2015 | Ruvio | H04L 63/1408 |
| | | | | 726/23 |
| 2016/0086391 | A1* | 3/2016 | Ricci | G06Q 10/10 |
| | | | | 701/29.3 |
| 2016/0205117 | A1* | 7/2016 | Laifenfeld | H04B 1/3822 |
| | | | | 726/23 |
| 2016/0330629 | A1* | 11/2016 | Laifenfeld | H04W 12/12 |
| 2016/0377726 | A1* | 12/2016 | Schipper | G01S 19/29 |
| | | | | 342/357.59 |
| 2016/0381068 | A1* | 12/2016 | Galula | H04L 63/123 |
| | | | | 726/23 |
| 2017/0013005 | A1* | 1/2017 | Galula | H04L 63/1425 |
| 2017/0057540 | A1* | 3/2017 | Anma | B62D 6/003 |
| 2017/0269224 | A1* | 9/2017 | Zhang | G01S 19/071 |
| 2017/0278323 | A1* | 9/2017 | Gupta | G06F 21/50 |
| 2018/0106586 | A1* | 4/2018 | Gruber | G01B 21/045 |
| 2018/0109622 | A1* | 4/2018 | Galula | H04L 67/12 |
| 2018/0173229 | A1* | 6/2018 | Huang | G05D 1/0088 |
| 2018/0196941 | A1* | 7/2018 | Ruvio | H04W 12/1208 |
| 2018/0255082 | A1* | 9/2018 | Ostergaard | G06N 20/00 |
| 2018/0295147 | A1* | 10/2018 | Haga | H04L 12/40 |
| 2018/0316584 | A1* | 11/2018 | Ujiie | H04W 4/48 |
| 2018/0330083 | A1* | 11/2018 | Abbaszadeh | G06N 20/00 |
| 2019/0005237 | A1* | 1/2019 | Long | G06N 3/084 |
| 2019/0042738 | A1* | 2/2019 | Juliato | H04L 63/1483 |
| 2019/0044912 | A1* | 2/2019 | Yang | G06F 9/45558 |
| 2019/0191020 | A1* | 6/2019 | Hamada | B60R 16/023 |
| 2019/0258904 | A1* | 8/2019 | Ma | G06K 9/6269 |
| 2019/0266484 | A1* | 8/2019 | Maluf | H04L 12/40 |
| 2019/0266499 | A1* | 8/2019 | Maluf | G06N 7/005 |
| 2019/0279440 | A1* | 9/2019 | Ricci | H04W 4/48 |
| 2019/0308589 | A1* | 10/2019 | Maluf | B60R 25/104 |
| 2019/0334932 | A1* | 10/2019 | Nuqui | H04L 63/20 |
| 2019/0342115 | A1* | 11/2019 | Lieder | H04L 43/16 |
| 2020/0008707 | A1* | 1/2020 | Li | A61B 6/032 |
| 2020/0053112 | A1* | 2/2020 | Torisaki | H04L 63/1425 |
| 2020/0064436 | A1* | 2/2020 | Dang | G01S 13/52 |
| 2020/0067969 | A1* | 2/2020 | Abbaszadeh | G06K 9/6269 |
| 2020/0218991 | A1* | 7/2020 | Alanqar | G06N 5/04 |
| 2020/0363218 | A1* | 11/2020 | Kim | G01S 13/86 |

OTHER PUBLICATIONS

A. Fakharian, T. Gustafsson and M. Mehrfam, "Adaptive Kalman filtering based navigation: An IMU/GPS integration approach," 2011 International Conference on Networking, Sensing and Control, Delft, 2011, pp. 181-185, doi: 10.1109/ICNSC.2011.5874871. (Year: 2011).*

Campbell, Mikey., "Apple patents 'super resolution' multi-sensor cameras with cube prisms", http://appleinsider.com/articles/16/10/11/apple-patents-super-resolution-multi-sensor-cameras-display-integrated-light-sensor-tech-, 2 pages, Oct. 11, 2016, appleinsider.com.

Costlow, Terry., "New NXP system drives sensor fusion for autonomous vehicles", Safety—Human Factors and Ergonomics, http://articles.sae.org/14837/, 1 page, May 31, 2016, SAE International.

Estl, et al., "Sensor fusion: A critical step on the road to autonomous vehicles", http://www.eenewseurope.com/news/sensor-fusion-critical-step-road-autonomous-vehicles, Apr. 11, 2016, 2 pages, eeNewsEurope.com.

Hu, et al., "Adaptive Kalman Filtering for Vehicle Navigation", Journal of Global Positioning Systems, vol. 2, No. 1 : 42-47, 2003, 6 pages, CPGPS.

Maluf, et al., "The 3D Recognition, Generation, Fusion Update and Refinement (RG4) Concept", 6th International Symposium on Artificial Intelligence, Robotics and Automation in Space, 2001, 9 pages.

Maluf, D.A., "World Modeling in Radar: A Regularization by Synthesis", Doctoral dissertation, 142 pages, May 1995, McGill University.

Morris, et al., "A Bayesian Approach to High Resolution 3D Surface Reconstruction from Multiple Images", Proceedings of the IEEE Signal Processing Workshop on Higher-Order Statistics, 4 pages, 1999, IEEE.

Smelyanskiy. et al., "Bayesian super-resolved surface reconstruction from images", IEEE Conference on Computer Vision and Pattern Recognition, 8 pages, 2000, IEEE.

Song, et al., "Intrusion detection system based on the analysis of time intervals of CAN messages for in-vehicle network", 2016 International Conference on Information Networking (ICOIN), 2016, pp. 63-68, IEEE.

"High-Precision Vehicle Navigation using Kalman Filter Algorithm", http://license.umn.edu/technologies/z07191_high-precision-vehicle-navigation-using-kalman-filter-algorithm, 1 page, Accessed Dec. 13, 2017, Regents of the University of Minnesota.

"State Estimation Using Time-Varying Kalman Filter", https://www.mathworks.com/help/control/examples/state-estimation-using-time-varying-kalman-filter.html, Accessed Dec. 13, 2017, 6 pages, The MathWorks, Inc.

"Unmanned Autonomous Vehicles: Pros and Cons of Multiple Sensor Fusion", http://resources.altium.com/pcb-design-blog/unmanned-autonomous-vehicles-multiple-sensor-fusion-pros-cons, 6 pages, May 12, 2017, Altium.

* cited by examiner

VEHICLE NETWORK INTRUSION DETECTION SYSTEM (IDS) USING VEHICLE STATE PREDICTIONS

TECHNICAL FIELD

The present disclosure relates generally to computer networks, and, more particularly, to vehicle network intrusion detection system (IDS) using state estimations.

BACKGROUND

In recent years, the amount and type of data collected by cloud-based services and data centers from edge devices has been increasing significantly. This is particularly true in the case of edge devices, such as passenger and commercial vehicles. For example, a vehicle of the future may produce multiple terabytes (TBs) of data per day. However, many existing gateways do not support the size requirements of this additional data. Notably, a typical mobile gateway operates over a Long-Term Evolution (LTE) cellular connection at the lower Megabits range speed. For example, consider a Lidar sensor in a vehicle that produces over 2 TB of data per day. In such a case, it would be impractical to transmit this data over an existing Gigabit switch. With the ongoing efforts to develop smart cars and autonomous vehicles, as well as to outfit vehicles with more and more sensors, these data requirements will only continue to increase, placing an increasing burden on the communication infrastructure.

As vehicle networks carry an ever-increasing amount of data with greater and greater complexity, the potential for malicious actors to infiltrate a vehicle network is also increasing. For example, one can envision malware infecting a vehicle to take control over a component or sub-system of the vehicle. This is of particular concern with respect to autonomous/self-driving vehicles. However, other, more subtle, forms of malware may falsify data on the vehicle network, such as sensor readings or the like.

BRIEF DESCRIPTION OF THE DRAWINGS

The embodiments herein may be better understood by referring to the following description in conjunction with the accompanying drawings in which like reference numerals indicate identically or functionally similar elements, of which.

DESCRIPTION OF EXAMPLE EMBODIMENTS

Overview

Figure 1A:
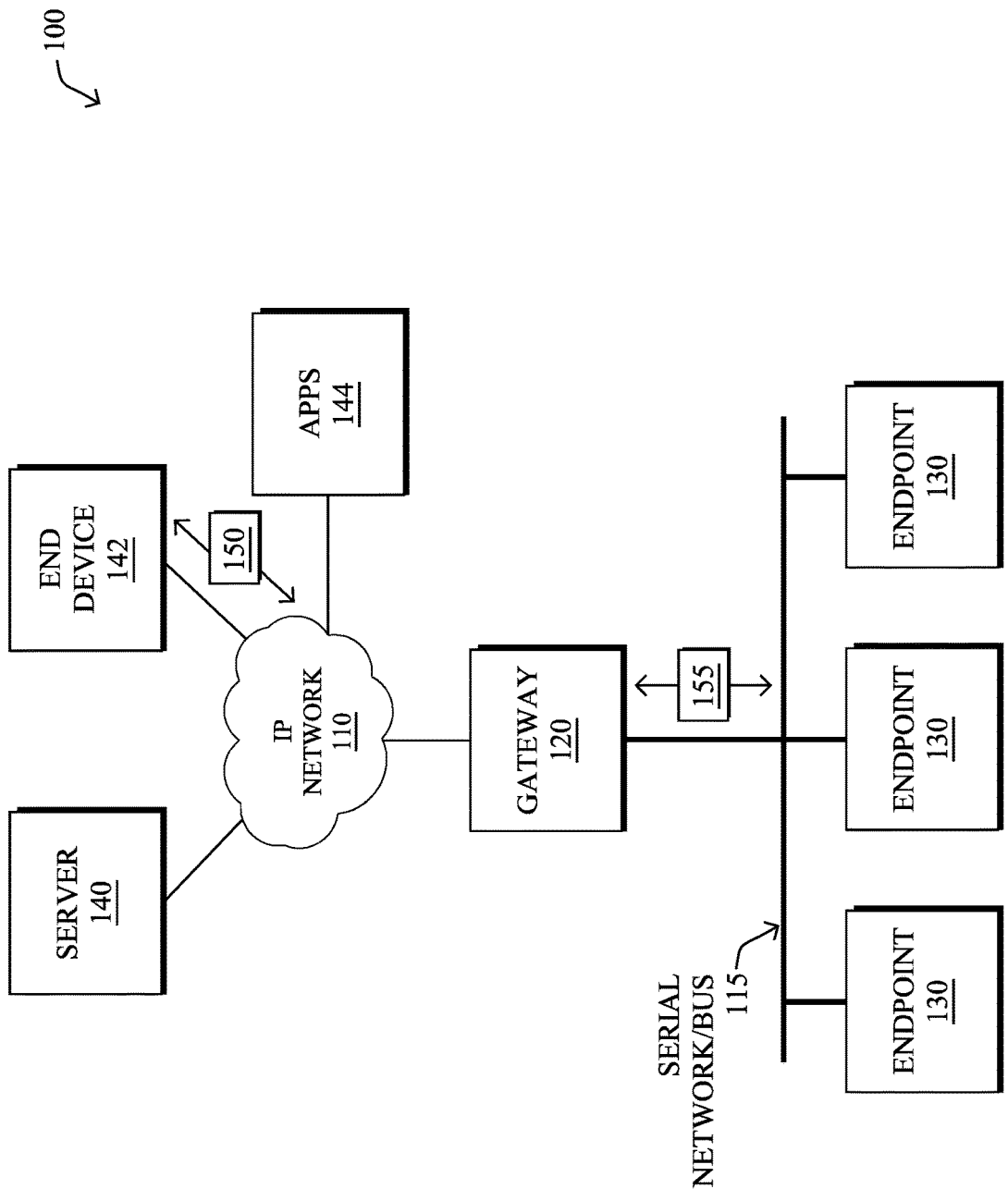
FIGS. 1A-1B illustrate an example communication system.

According to one or more embodiments of the disclosure, a processor of a vehicle predicts a state of the vehicle using a behavioral model. The model is configured to predict the state based in part on one or more state variables that are available from one or more sub-systems of the vehicle and indicative of one or more physical characteristics of the vehicle. The processor computes a representation of a difference between the predicted state of the vehicle and a measured state of the vehicle indicated by one or more state variables available from the one or more sub-systems of the vehicle. The processor detects a malicious intrusion of the vehicle based on the computed representation of the difference between the predicted and measured states of the vehicle exceeding a defined threshold. The processor initiates performance of a mitigation action for the detected intrusion, in response to detecting the malicious intrusion of the vehicle.

DESCRIPTION

A computer network is a geographically distributed collection of nodes interconnected by communication links and segments for transporting data between end nodes, such as personal computers and workstations, or other devices, such as sensors, etc. Many types of networks are available, ranging from local area networks (LANs) to wide area networks (WANs). LANs typically connect the nodes over dedicated private communications links located in the same general physical location, such as a building or campus. WANs, on the other hand, typically connect geographically dispersed nodes over long-distance communications links, such as common carrier telephone lines, optical lightpaths, synchronous optical networks (SONET), synchronous digital hierarchy (SDH) links, and others.

Smart object networks, such as sensor networks, in particular, are a specific type of network having spatially distributed autonomous devices such as sensors, actuators, etc., that cooperatively monitor physical or environmental conditions at different locations, such as, e.g., energy/power consumption, resource consumption (e.g., water/gas/etc. for advanced metering infrastructure or "AMI" applications) temperature, pressure, vibration, sound, radiation, motion, pollutants, etc. Other types of smart objects include actuators, e.g., responsible for turning on/off an engine or perform any other actions. Sensor networks, a type of smart object network, are typically shared-media networks, such as wireless or power-line communication (PLC) networks. That is, in addition to one or more sensors, each sensor device (node) in a sensor network may generally be equipped with a radio transceiver or other communication port, a microcontroller, and an energy source, such as a battery. Often, smart object networks are considered field area networks (FANs), neighborhood area networks (NANs), etc. Generally, size and cost constraints on smart object nodes (e.g., sensors) result in corresponding constraints on resources such as energy, memory, computational speed and bandwidth.

Networks may also be, or may include, an "Internet of Things" or "IoT" network. Loosely, the term "Internet of Things" or "IoT" may be used by those in the art to refer to uniquely identifiable objects (things) and their virtual representations in a network-based architecture. In particular, the next frontier in the evolution of the Internet is the ability to connect more than just computers and communications devices, but rather the ability to connect "objects" in general, such as lights, appliances, vehicles, HVAC (heating, ventilating, and air-conditioning), windows and window shades and blinds, doors, locks, etc. The "Internet of Things" thus generally refers to the interconnection of objects (e.g., smart objects), such as sensors and actuators, over a computer network (e.g., IP), which may be the Public Internet or a private network. Such devices have been used in the industry for decades, usually in the form of non-IP or proprietary protocols that are connected to IP networks by way of protocol translation gateways. With the emergence of a myriad of applications, such as the smart grid, smart cities, and building and industrial automation, and cars (e.g., that can interconnect millions of objects for sensing things like power quality, tire pressure, and temperature and that can actuate engines and lights), it has been of the utmost importance to extend the IP protocol suite for these networks.

Serial networks are another type of network, different from an IP network, typically forming a localized network in a given environment, such as for automotive or vehicular networks, industrial networks, entertainment system networks, and so on. For example, those skilled in the art will be familiar with the on-board diagnostics (OBD) protocol (a serial network which supports a vehicle's self-diagnostic and reporting capability, including the upgraded "OBD II" protocol), the Controller Area Network (CAN) bus (or CANBUS) protocol (a message-based protocol to allow microcontrollers and devices to communicate with each other in applications without a host computer), and the MODBUS protocol (a serial communications protocol for use with programmable logic controllers, such as for remote terminal units (RTUs) in supervisory control and data acquisition (SCADA) systems). Unlike an IP-based network, which uses a shared and open addressing scheme, a serial communication network generally is based on localized and proprietary communication standards, where commands or data are transmitted based on localized device identifiers, such as parameter identifiers (PIDs), localized station addresses, and so on.

FIG. 1A illustrates an example communication system 100 illustratively comprising an Internet Protocol (IP) network 110 and a serial network/bus 115, along with a gateway (or other network device) 120 interconnecting the two networks, as described in greater detail below. Serial network 115, in particular, illustratively comprises one or more endpoints 130 (e.g., a set of one or more controlled devices, sensors, actuators, controllers, processors, and so on), such as part of a vehicular network, an industrial network, etc. The endpoints may be interconnected by various methods of serial communication. For instance, the serial network/bus 115 may allow the endpoints 130 to communicate serial data 155 (e.g., commands, sensor data, etc.) using predefined serial network communication protocols (e.g., OBD, CANBUS, MODBUS, etc.). In this context, a serial network protocol consists of a set of rules defining how the endpoints interact within the serial network 115.

IP network 110, on the other hand, illustratively comprises links interconnecting one or more devices through a network of routers or switches. For example, a set of one or more servers (or controllers) 140, one or more end devices (e.g., user devices, workstations, etc.) 142, and one or more other application devices 144 may be interconnected with the IP network 110. The devices, generally, may be interconnected by various methods of IP-based communication. For instance, the links may be wired links or shared media (e.g., wireless links, PLC links, etc.) where certain devices may be in communication with other devices, e.g., based on distance, signal strength, current operational status, location, etc. IP data packets 150 (e.g., traffic and/or messages sent between the devices/nodes) may be exchanged among the nodes/devices of the IP network 110 using predefined IP network communication protocols such as the transmission control protocol (TCP), TCP/IP, user datagram protocol (UDP), or other protocols where appropriate. In this context, an IP network protocol consists of a set of rules defining how the nodes interact with each other over the IP network 110.

As described below, the gateway device 120 illustratively bridges both the IP network 110 and serial network 115, and as such may be considered to be a part of either or each network, accordingly. Further, those skilled in the art will understand that any number of nodes, devices, links, endpoints, etc. may be used in the computer system 100, and that the view shown herein is for simplicity. Also, those skilled in the art will further understand that while the system is shown in a certain orientation, system 100 is merely an example illustration that is not meant to limit the disclosure.

Figure 1B:
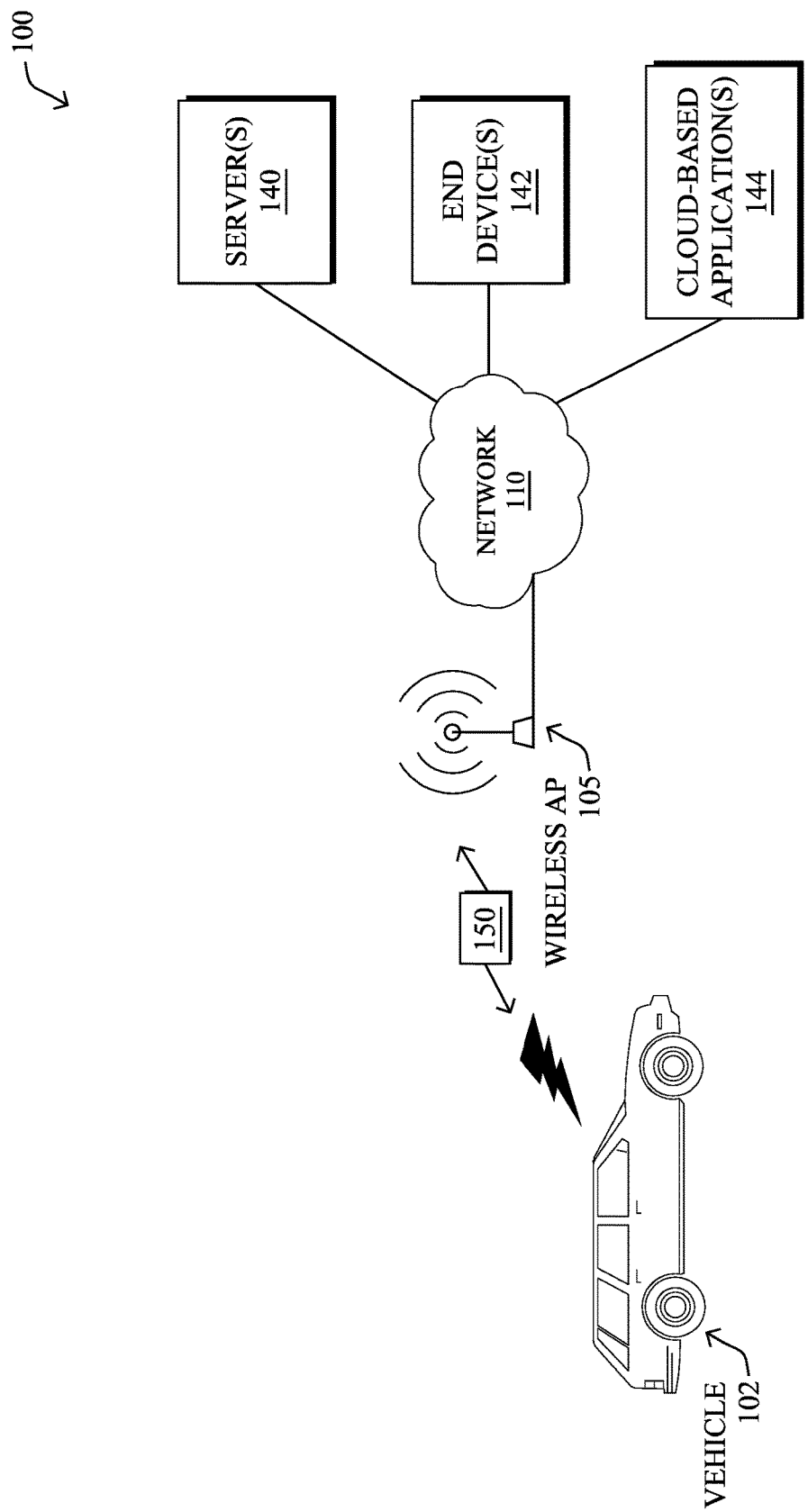

FIG. 1B illustrates one potential implementation of communication system 100, according to various embodiments. As shown, assume that system 100 includes a vehicle 102 in which serial network/bus 115 and gateway 120 are located. For example, many passenger vehicles now include a CAN-Bus-based serial network that connects any number of endpoint sensors and/or actuators (endpoints 130). To connect the serial network 115 of vehicle 102 to IP network 110, gateway 120 resident on vehicle 102 may communicate remotely with a wireless access point (AP) 105. For example, vehicle 102 may be in remote communication with a cellular transceiver, Wi-Fi hotspot, or the like, to connect vehicle 102 with network 110. In further embodiments, vehicle 102 may instead be in communication with network 110 via a wired connection. For example, vehicle 102 may be connected to network 110 during charging (e.g., in the case an electric or hybrid electric vehicle), storage, repair, or the like.

Figure 2:
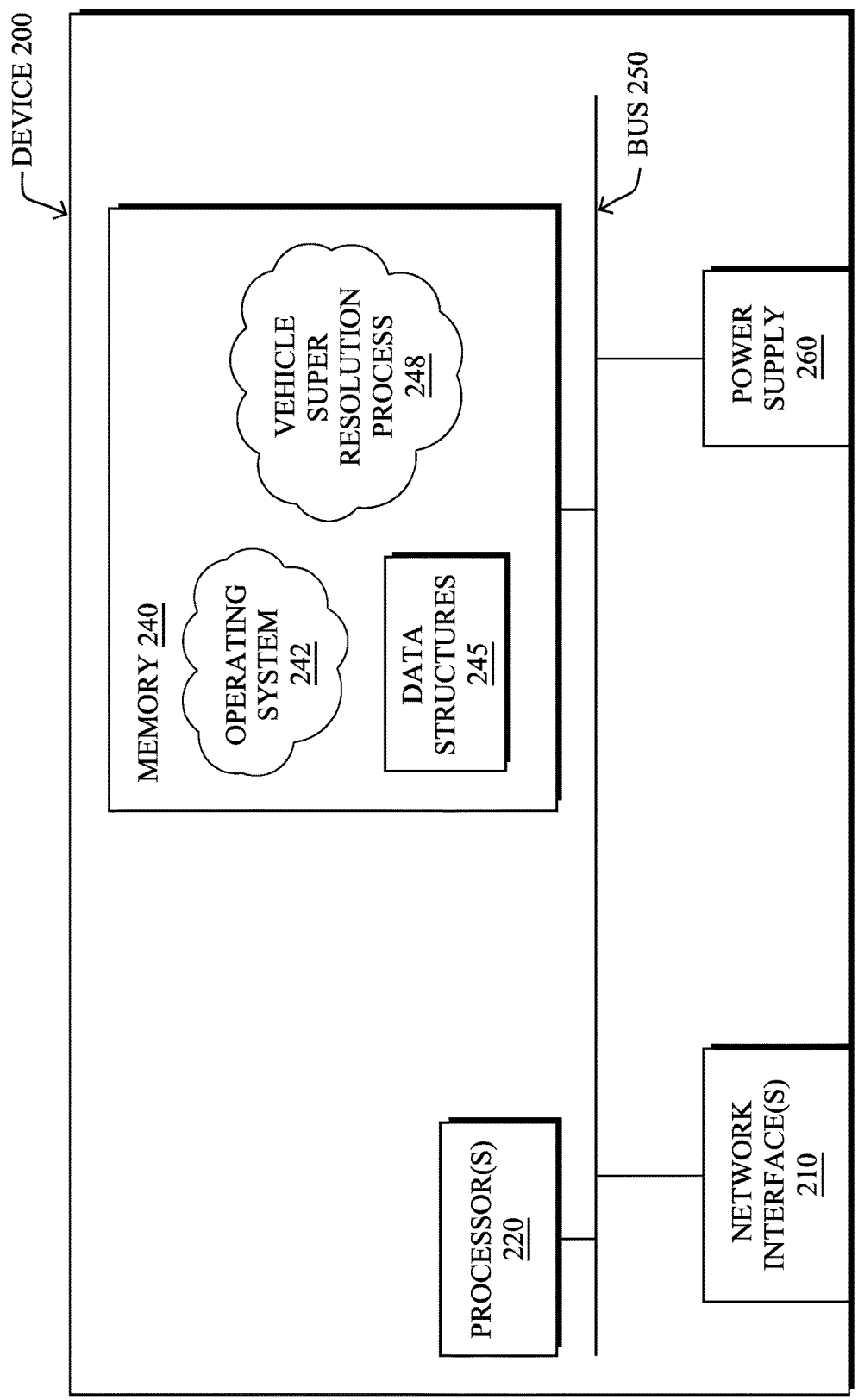
FIG. 2 illustrates an example network device/node.

FIG. 2 is a schematic block diagram of an example node/device 200 that may be used with one or more embodiments described herein, e.g., as any of the nodes/devices shown in FIG. 1 above, particularly as the gateway device 120 as described herein. The device may comprise one or more network interfaces 210 (e.g., wired, wireless, PLC, etc.), at least one processor 220, and a memory 240 interconnected by a system bus 250, as well as a power supply 260 (e.g., battery, plug-in, etc.).

Network interface(s) 210 include the mechanical, electrical, and signaling circuitry for communicating data over links coupled to the IP network 110 and/or serial network 115. The network interfaces 210 may be configured to transmit and/or receive data using a variety of different IP communication protocols, such as TCP/IP, UDP, etc. Note that the device 200 may have multiple different types of IP network connections 210, e.g., wireless and wired/physical connections, and that the view herein is merely for illustration. Also, while the IP network interface 210 is shown separately from power supply 260, for PLC the network interface 210 may communicate through the power supply 260, or may be an integral component of the power supply. In some specific configurations the PLC signal may be coupled to the power line feeding into the power supply.

In further embodiments, network interface(s) 210 may also include the other hand, include the mechanical, electrical, and signaling circuitry for communicating data over links coupled to the serial network 115. Notably, one or more of network interface(s) 210 may be configured to transmit and/or receive data using a variety of different serial communication protocols, such as OBD, CANBUS, MODBUS, etc., on any range of serial interfaces such as legacy universal asynchronous receiver/transmitter (UART) serial interfaces and modern serial interfaces like universal serial bus (USB).

The memory 240 comprises a plurality of storage locations that are addressable by the processor 220 and the network interfaces 210 for storing software programs and data structures associated with the embodiments described herein. The processor 220 may comprise hardware elements or hardware logic adapted to execute the software programs and manipulate the data structures 245. An operating system 242, portions of which are typically resident in memory 240 and executed by the processor, functionally organizes the device by, among other things, invoking operations in support of software processes and/or services executing on the device. These software processes/services may comprise an illustrative vehicle super resolution process 248, as described herein. Note that while process 248 is shown in centralized memory 240 alternative embodiments provide for the process to be specifically operated within the network interface(s) 210.

It will be apparent to those skilled in the art that other processor and memory types, including various computer-readable media, may be used to store and execute program instructions pertaining to the techniques described herein. Also, while the description illustrates various processes, it is expressly contemplated that various processes may be embodied as modules configured to operate in accordance with the techniques herein (e.g., according to the functionality of a similar process). Further, while the processes have been shown separately, those skilled in the art will appreciate that processes may be routines or modules within other processes.

Many serial network endpoints, such as sensors and actuators found in vehicular or industrial systems, are specifically tailored to function based on a proprietary serial communication protocol. Typically, such endpoints are also not natively enabled for IP communication. That is, in many serial network implementations, the commands and data consumption for the endpoints occurs on a device that is also a part of the serial network.

As noted above, the amount of data generated by network edge devices, specifically from connected passenger and commercial vehicles, and its collection by data consumers, such as cloud and data centers, is significantly increasing. For example, it can be assumed that there will be future requirements to stream data (telemetry) in real-time representing different data points in a vehicle from the CANBUS of the vehicle to answer particular questions in a cloud environment. However, the capabilities of existing communication infrastructures present a real limit on this data transfer and this data transfer limitation is expected to persist for many years to come.

At least on the surface, data compression would seem to be the natural approach to address the limited bandwidth of the communication infrastructure. However, doing so also typically entails distorting the data in some manner. Data should never be tampered with and should be left alone. Data is what was observed and cannot be changed after the event.

Vehicle Telematics with Super Resolution

According to various aspects of the techniques herein, it is possible to construct physical and behavioral models of the underlying physics of a system that "best" predict the observed data. In the particular case of vehicles, these models can be used to project new, synthetic data points at an even higher resolution and fidelity than that of the observed data points from the CANBUS or other sensors. In various aspects, these models reflect the states of the vehicle system as variables which could correspond at least to the underlying data, and exceed the measured points and even derive estimates for those not measured. The derivations are purely computed from the physical models and, thus, rely on how the physical characteristics of the vehicle are related. By way of simple example, the acceleration of the vehicle can be modeled and derived from other sensor inputs, even though few vehicles are actually equipped accelerometers.

Illustratively, the techniques described herein may be performed by hardware, software, and/or firmware, such as in accordance with the vehicle super resolution process 248, which may include computer executable instructions executed by the processor 220 (or independent processor of interfaces 210) to perform functions relating to the techniques described herein.

Figure 3:
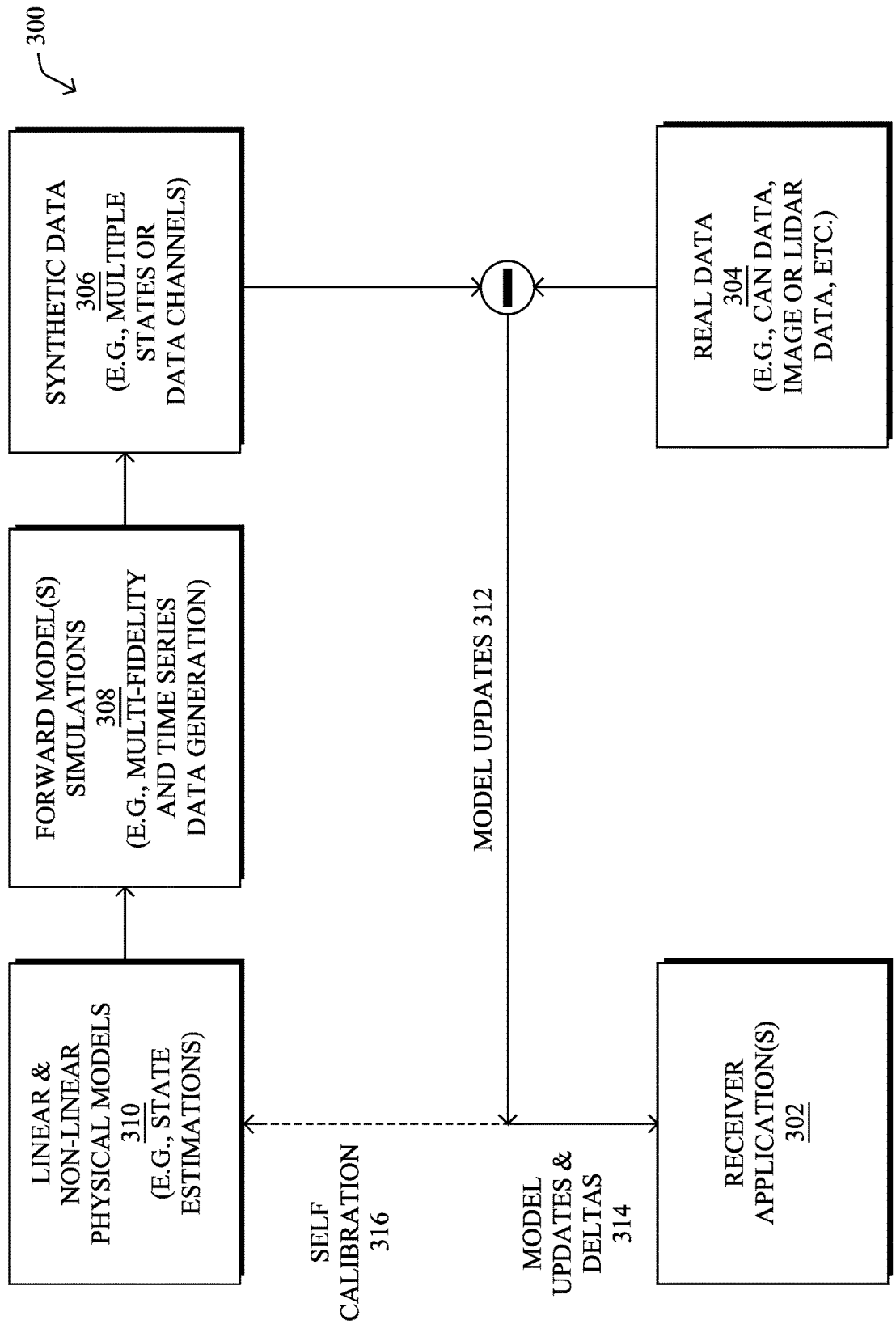
FIG. 3 illustrates an example architecture for vehicle telematics with super resolution.

FIG. 3 illustrates an example architecture 300 for vehicle telematics with super resolution, according to various embodiments. As shown, assume that there are one or more receiver applications 302 that use as input data indicative of the physical characteristics of the vehicle. In various embodiments, the receiver application(s) 302 may be local to the vehicle itself (e.g., vehicle 102 shown in FIG. 1B) or, alternatively, at a remote location, such as a server 140, end device 142, or cloud-based application 144.

With respect to the physical characteristics of the vehicle, the vehicle itself may include any number of interconnected sub-systems that comprise any number of sensors. Notably, the vehicle itself may include any number of CAN buses or other sub-systems that provide the sensor data to a microcontroller or other processing circuit local to the vehicle. Accordingly, these sensors and sub-systems may provide real data 304 that is indicative of the physical characteristics of the vehicle. For example, real data 304 may include CANBUS data, image data, Lidar data, or the like, that comprises actual measurement values of the physical characteristics of the vehicle.

As would be appreciated, the collection of these measurements, as well as their reporting via their respective sub-systems, may also vary from a temporal standpoint. For example, the update frequency of a GPS system may be quite different than that of an odometer reading from a CANBUS sub-system of the vehicle. In addition, because of the potential limitations of the communication infrastructure in conveying real data 304 to receiver application(s) 302, it may not be possible to send real data 304 to application(s) 302 for use in real-time or at the input rate needed by application(s) 302.

As shown, there may be linear and/or non-linear physical models 306 that describe the relationships between the physical characteristics of the vehicle. These models may, for example, allow for the computation of state estimations of the vehicle and determine conditions of the vehicle that are not directly measured by real data 304. For example, in the case of acceleration, this physical characteristic of the vehicle may be a function of the velocity and traveled distance of the vehicle over time. Such models 306 may be known or assumed, depending on the characteristics involve.

According to various embodiments, architecture 300 may perform any number of simulations 308 using forward model(s) that are based on the underlying physical models 306. For example, these simulations 308 may use multi-fidelity and time series data generation to generate synthetic data 310 (e.g., multiple states, data channels, etc.). Generally speaking, synthetic data 310 may include predicted states/characteristics of the vehicle that were not measured directly by the sub-systems of the vehicle, but were instead inferred based on the actual sensor measurements and on the prior state(s) of the vehicle.

In many embodiments, architecture 300 may leverage machine learning for the forward model(s) of simulations 308, so as to make better state predictions about the vehicle. In general, machine learning is concerned with the design and the development of techniques that receive empirical data as input (e.g., real telemetry data from the vehicle) and recognize complex patterns in the input data. For example, some machine learning techniques use an underlying model M, whose parameters are optimized for minimizing the cost function associated to M, given the input data. For instance, in the context of classification, the model M may be a straight line that separates the data into two classes (e.g., labels) such that M=a*x+b*y+c and the cost function is a function of the number of misclassified points. The learning process then operates by adjusting the parameters a,b,c such that the number of misclassified points is minimal. After this optimization/learning phase, the model M can be used to classify new data points, such as information regarding new traffic flows in the network. Often, M is a statistical model, and the cost function is inversely proportional to the likelihood of M, given the input data.

Example machine learning techniques that can be used to perform simulations 308 may include, but are not limited to, nearest neighbor (NN) techniques (e.g., k-NN models, replicator NN models, etc.), statistical techniques (e.g., Bayesian networks, Kalman filtering, etc.), clustering techniques (e.g., k-means, mean-shift, etc.), neural networks (e.g., reservoir networks, artificial neural networks, etc.), support vector machines (SVMs), logistic or other regression, Markov models or chains, principal component analysis (PCA) (e.g., for linear models), multi-layer perceptron (MLP) ANNs (e.g., for non-linear models), replicating reservoir networks (e.g., for non-linear models, typically for time series), random forest classification, or the like.

In summary, the assumption made in architecture 300 is that, given the physical and behavioral models 306, architecture 300 can probabilistically predict what would be observed (the expected data), as well as what is not actually observed, through the underlying models and the measured data, to uphold the boundary conditions of the computational models. In turn, the resulting synthetic data 310 can be provided to receiver application(s) 302.

During operation, architecture 300 may compare the synthetic data 310 computed by simulations 308 to the real data 304 actually observed by the vehicle, to produce model updates 312. For example, architecture 300 may determine that a delta exists between the predicted state of the vehicle by simulations 308 and what is indicated by real data 304 from the sub-system(s) of the vehicle. In turn, these model updates and deltas 314 may be provided to receiver application(s) 302 and can also be used as self-calibration data 316, to recalibrate the models used to generate synthetic data 310.

Figure 4A:
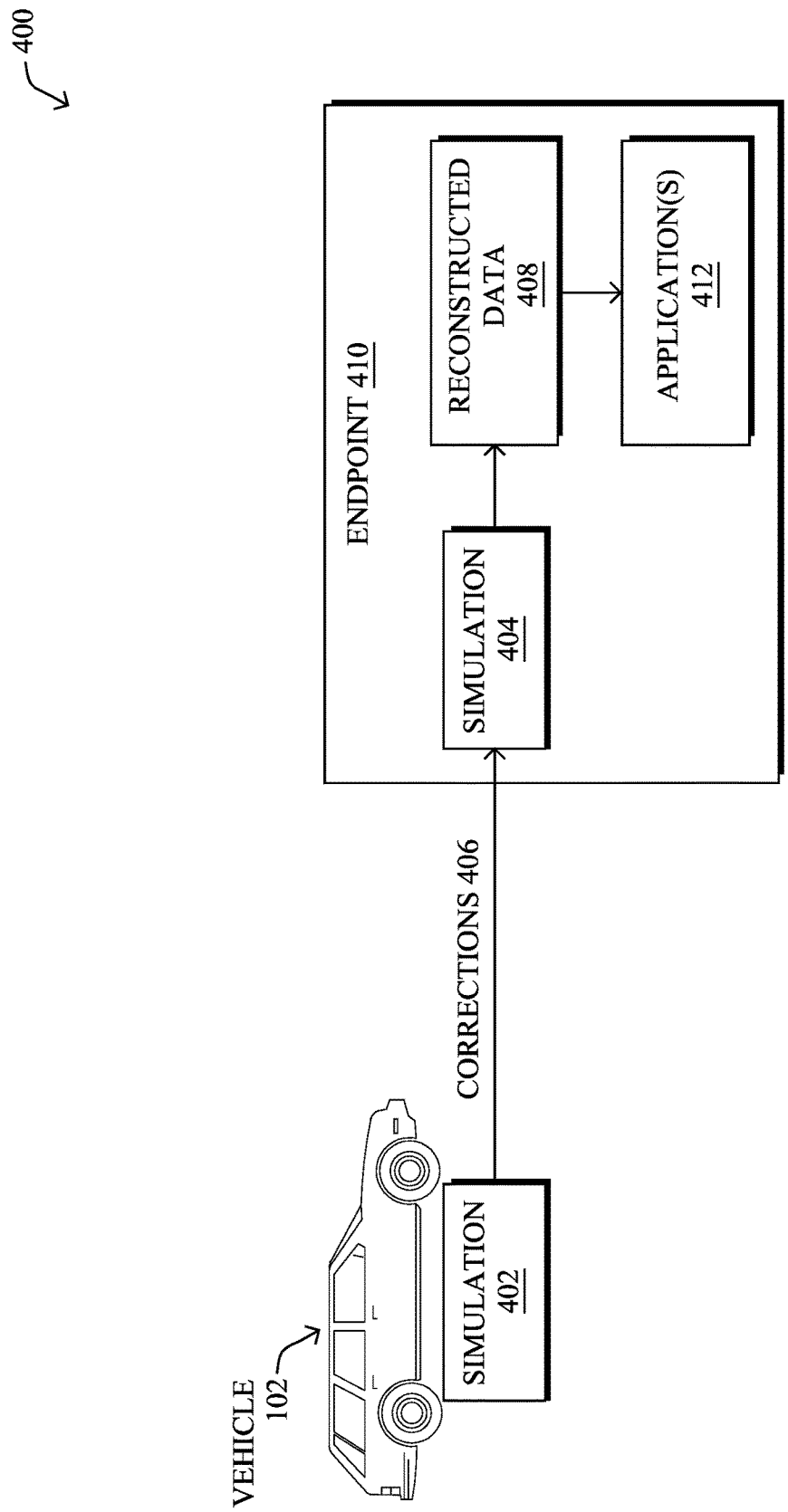
FIGS. 4A-4B illustrate an example of a vehicle providing data to a receiver application.
Figure 4B:
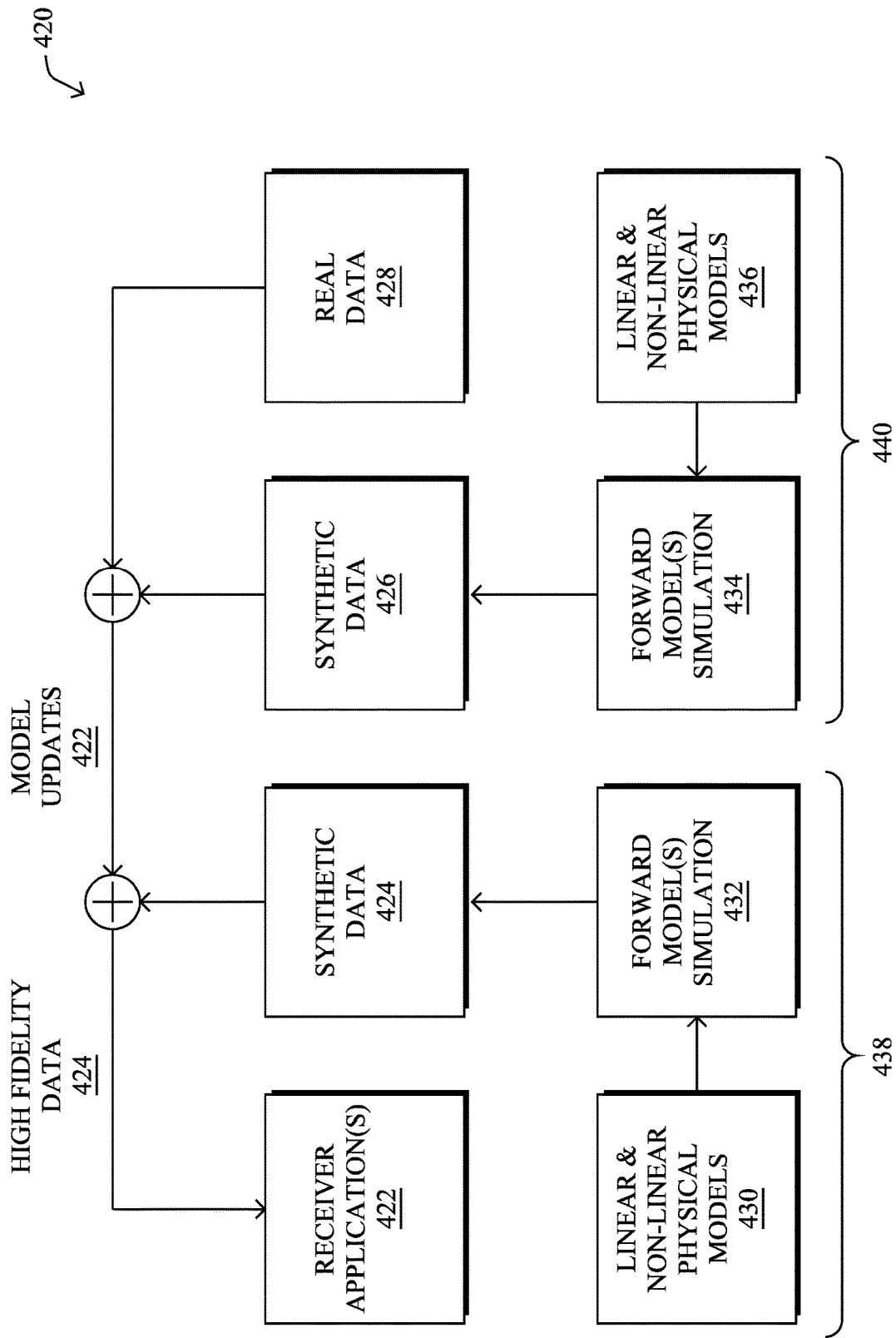

FIGS. 4A-4B illustrate an example of a vehicle providing data to a receiver application, according to various embodiments. As shown in FIG. 4A, in the particular cases of vehicle to vehicle (V2V) or vehicle to infrastructure (V2I) communications, vehicle 102 may send data to an endpoint 410 (e.g., a server, cloud service, end device, etc.). In such a case, network "compression" may be achieved by performing two simultaneous simulations of the vehicle: a local simulation 402 on-board vehicle 102 and a separate simulation 404 on endpoint 410 that output reconstructed data 408 for consumption by the receiver application(s) 412.

When vehicle 102 detects deltas between the state predictions of its simulation 402 and the real data from its sub-systems, vehicle 102 may send the appropriate corrections 406 to simulation 404.

Very high network compressibility is reached when the synthetic/reconstructed data 408 computed by simulation 404 produces good estimates from the models. The same difference is also computed and tracked in vehicle 102 validating that the errors are within the tolerance limits. In practice, the tolerance limit follows the noise tolerance of the sensors of vehicle 102 generating the real data. Adjustments are then reported to the cloud on an as-needed basis via corrections 406.

The assumption is considered that compressibility using this technique will remove only noise (data lost) from the actual data. This is the differentiation when compared to other compression techniques. The benefits to this approach are three folds:
Continuous streaming
High compression ratio
Low noise to signal ratio Further advantages are found with this approach in how to resolve conflicting data points coming from independent data points in the in-vehicle system. For example, a known conflict is found between the vehicle speed/odometer as the measurements from the CANBUS sub-system will conflict with the Global Position Systems (GPS) data measurements, begin another sub-system. In fact, GPS applications derive speed and distances in a global sense, which are computed from estimates of the longitudes, latitudes, and elevations associated with the vehicle. In contrast, the vehicle speed and odometer measurements are local to the vehicle, calculated from the revolutions per minute (RPM) of the wheels of the vehicle.

Architecture 420 in FIG. 4B further illustrates the concepts of FIG. 4A, in various embodiments. As shown, assume that there exists one or more receiver applications 422 that take as input data indicative of the physical states of a vehicle or other monitored system. Such a vehicle or other system may capture real data 428 regarding at least some of these characteristics (e.g., via sensors, etc.). Instead of providing real data 428 directly to receiver application(s) 422, forward model simulations 434 that are based on the underlying linear and non-linear physical models 436 may be used to produce synthetic data 426. Thus, in the example shown, architecture 420 may include a sender 440 that captures real data 428 and generates synthetic data 426, as well as a receiver 438 that includes the receiver application(s) 422 that are to leverage this data. In some embodiments, receiver 438 may be remote from that of sender 440, such as external to the vehicle itself. However, further embodiments also provide for sender 440 and receiver 438 to both be located on-board the vehicle.

During operation, receiver 438 may itself mimic the forward simulations 434 of sender 440 using its own forward model simulation 432 and based on the underlying linear and/or non-linear physical models 430 for the vehicle. This allows the receiver 438 to output synthetic data 424 for use by application(s) 422. Model updates 422 provided by sender 440 may be used to adjust the operations/predictions of receiver 438, when sender 440 detects differences between real data 428 and synthetic data 426. This allows receiver 428 to effectively reconstruct the vehicle states from model updates 422 directly. As a result, receiver application(s) 422 may receive as input the resulting high fidelity data 424.

In other words, the models used in architecture 420 perform the central thinking role for all of the real information in the data. These models are constructed from the prior knowledge of the physical processes and how physical dynamics interacts with their environment. Furthermore, vehicles are also designed and built from physics models. This central model could loosely be described as the system that "models" data, but it is not itself "data" or a "data product."

To achieve the highest reliability with given measurements, the simulations may employ Bayesian probabilistic estimation, to allow robust statistical estimation of the most probable simulations, in various embodiments. Additionally, the uncertainty associated with the simulations can also be calculated. In particular, if the simulation uncertainty is high, it means that there is insufficient data/prior knowledge to accurately use the required model.

Another assumption that can be made is that the vehicle sensors are truly physical and, consequently, follow Gaussian probability distribution functions. The Bayesian approach then becomes an exercise of statistical computation of updating and tracking the means, variances and covariances. The Bayesian model-based data integration, outlined above (e.g., a dynamic and extended Kalman filter), in principle allows the system to integrate real measurements from multiple sub-system sources, which may be CAN-based or not. In addition, the proposed system can consume any modeled measurement at any frame update speed. There are many practical uses in merging computationally efficient different data points, especially in view of the huge amounts of data involved.

In other words, the approach introduced herein allows CAN data and other external data to be integrated into higher resolution data through the use of physical and behavioral models. The updated data is used by a compression application to determine whether data should be sent over the network. For example, odometers data and GPS data can be combined into higher fidelity estimates, using the super resolution techniques introduced herein. In such a case, the correlation between GPS and odometer data may be leveraged to eliminate redundancy in transmitting data over the network. All data can then be recreated, once received in the cloud or other receiver. In other words, the combination of different forms of sensor measurements (e.g., GPS, speed, odometer, tire pressure, etc.) can lead to higher data fidelity and time resolution than that of any particular form of sensor data alone.

In most commercial vehicles, model-based simulations (synthetic data) can be achieved today as an embedded, compute-enabled product. It can possibly be implemented, for example, deep within an in-vehicle network (IVN) engine control unit (ECU) in listening mode and as an end point to existing environment (e.g., by connecting CANBUS to other telemetry streams).

One can also assume that the measured data is continuously evaluated against the models and that noise estimation is made at a very high fidelity. Due to diversity of original equipment manufacturer (OEM) components in the automotive industry, different models can be used to retain quality and reflect different vehicle components and their relevant behaviors.

When more sensors and their resulting data points are translated through their underlying physics and behavioral laws to the high-resolution models, high-resolution data is consequently produced with optimal statistical definition. Simply put, the super resolution techniques provide a trade-analysis between the highly correlated data statistical threshold against multi-dimensional interpolation and extrapolation through the underlying physical and behavioral models.

Figure 5:
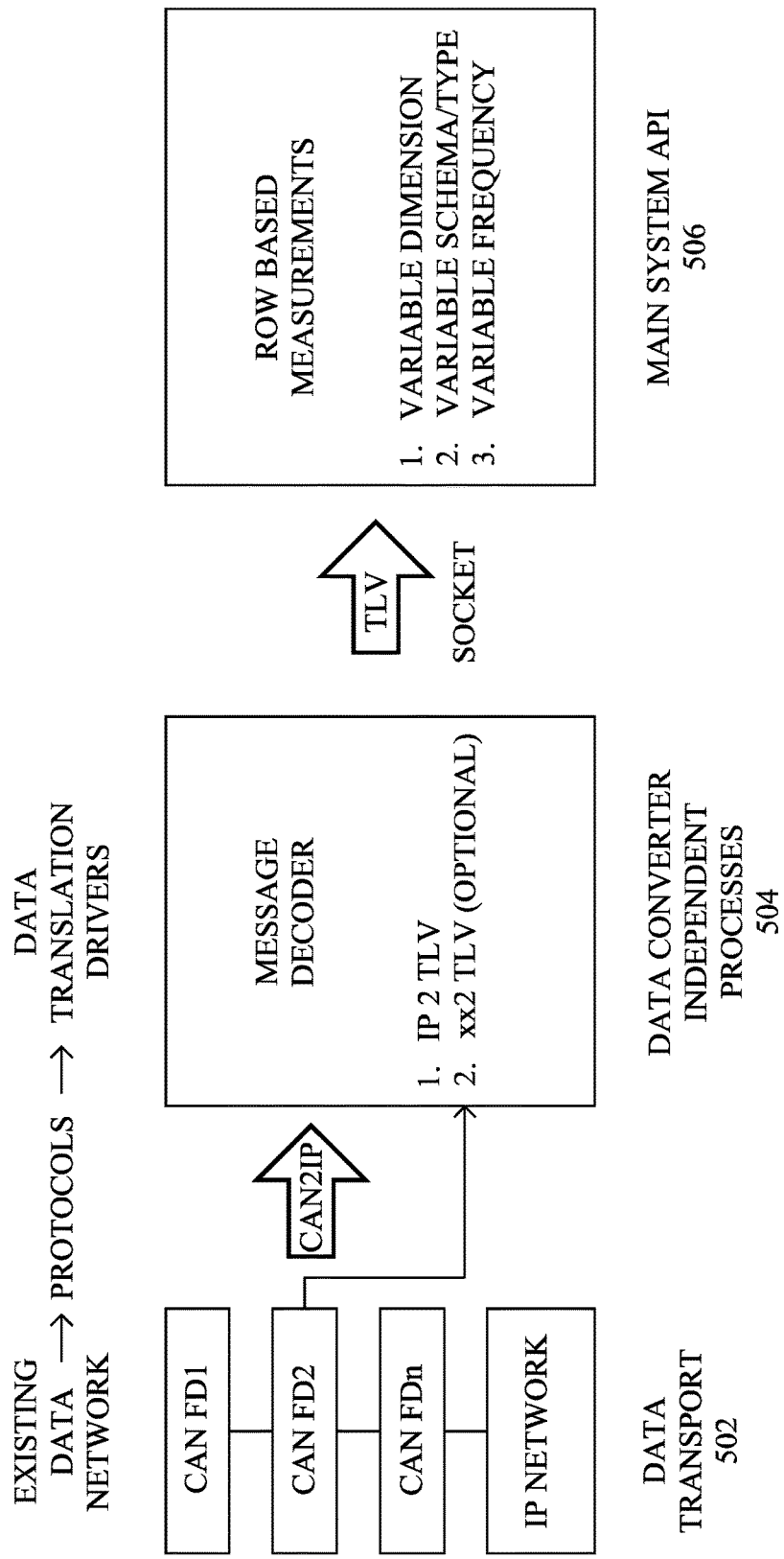
FIG. 5 illustrates an example of data conversion in a vehicle.

FIG. 5 illustrates an example 500 of data conversion in a vehicle, in various embodiments. From a data input standpoint, the super resolution system may be designed to be independent from the underlying I/O, for portability purposes, as well resource distributions in the environment. Accordingly, in some embodiments, software drivers may be used to convert the data into the system, independently. The three main criteria that dominate the data flow are the following:

1. Multiple data input
2. Asynchronous time of arrival of data
3. Variable count of measurements (at anytime)

As shown, consider the case of a vehicle that is equipped with a data transport 502 that comprises multiple CAN Flexible Data-Rate (FD) sub-systems running at potentially different clock rates (e.g., a first through $n^{th}$ CAN FD sub-system). In such a case, one CANBUS may produce measurements at a faster rate than that of another CANBUS. Faster CAN FD sub-systems are intended for modern vehicles that require higher CANBUS speeds. Indeed, many modern vehicles have at least two isolated CANBUS sub-systems. Typically, power train sensors are grouped and isolated on a faster sub-system network than the rest. As shown, the data transport 502 may also include other forms of networks, in some embodiments. For example, certain vehicles may also include one or more IP networks, such as to facilitate V2V or V2I communications and/or as a separate sub-system within the vehicle itself.

In general, the proposed system should asynchronously process the data at the rate at which it is detected. Accordingly, the vehicle may include data converter and independent processes 504 that handle the data from the existing data transport layer 502. For example, one such data conversion may multiplex the input data at the record input level to preserve the sequence of measurements sequences as well as the time they have been made. Furthermore, the system will recognize other known systems that produce additional measurements. For example, a GPS sub-system may be connected to an entertainment gateway over an IP network in data transport layer 502. In that case, the data produced from the GPS can be made available to the system.

To manage diverse data inputs with different time resolution and formats from data transport 502, the data converter 504 may abstract the data into variable Type-Length-Value (TLV) format and prepare it as input to the main super resolution system as APIs 506. For example, as shown, the input to the super resolution system may be a row of measurements where the columns are the sensors types. Furthermore, with different input streams, the types will vary from a row to row. Consideration is also taken that a row of measurement represents a collection of measurements taken at a specific time. In other words, a row may include an additional data type which reflects time or is the timestamp of that moment. The timestamp may be derived from the sensor readings, most cases. The system may then internally compute the time difference between two consecutive rows of measurements.

In addition to the drivers of data converter 504 converting the data formats from data transport 502 into a TLV format that defines the API as input to the system, the drivers may also decode the data representation found in the underlying protocol. This is typical in a CAN message: a driver in that case will decode a CAN message ID into a pair value (name, value) where the name is the type identification understood by the system. The drivers are mappings table that converts the OEM ID to the System data types. The value component is a 32/64 bits precision based on the software build options having the underlying hardware platform as a typical target.

In various embodiments, the underlying protocol may be a CAN2IP protocol whereby a single IP packet contains one or more CAN messages. The driver in that case will decode the CAN messages and encapsulate one or many into a row of TLVs. It is clear that the number of entries in a row will vary, with a minimum one measurement and up to the complete sensors arrays. The row containing a timestamp is optional. With the option of a lack of timestamp signature, the system will behave in a deterministic way and use a new timestamp inherited from the clock from the underlying hardware.

Behavioral Models for Vehicles

As noted above, data integration is not an easy task when it needs to be accomplished in an efficient, cheap, real-time, and comprehensive manner. Furthermore, data integration is worthless if the underlying data is unreliable. Data is as reliable as the underlying the sensing models. For example, a slight variance in the tire size can put an odometer off by hundreds of miles from its true value, even over a short period of time. For the modern and future transportation vehicles, sensing is the most essential component in such an endeavor. Understanding the data nowadays overcomes the mere necessity of data collection and data transportation. In other words, a critical task is to understand the data itself before decisions are made from the data.

Behavioral modeling in a vehicle can be better understood with the GPS analogy. In GPS systems, the underlying GPS data comprises time echoes from satellites within sight. Collecting time records alone is worthless. However, extracting longitude, latitude, and elevation as state estimates renders the GPS system workable to locate and track the position of a vehicle. The underlying technology for a GPS system is the Doppler Differential Kalman Filter.

The techniques herein introduce methodologies for modeling the underlying physics of a vehicle, so as to best predict the observed data. From such physical models, it is possible to project new derived data points at a higher resolution and fidelity, which appears as a set of state variables for the vehicle. In some aspects, this set is a union of state variables that are measured and those that are purely derived from physical and behavioral models. That is, given the model, the behavioral modeling techniques herein can probabilistically predict what would be observed (the expected data) and the non-observed through the underlying models.

Operationally, as noted, a vehicle may comprise multiple sub-systems, such as GPS, tire, fuel, engine, vehicle dynamics, and the like. Each of these sub-systems may be represented by a set of state variables. In turn, physical and behavioral models for these sub-systems can be developed to predict the behavior of the sub-systems over time. Such a model may, for example, predict the current state based on the n-th order derivative of previous states. In particular, the physical states may be modeled and represented as a state numerical vector in a vector matrix format for the said variables with dimension representing the states of interests.

In various embodiments, the state vector may be inserted in an enhanced dynamical, system recursion model that takes the following general format whereby '$0^{th}$' represents the current state, '$1^{th}$' represents the previous state, etc.:

$$[x0]=[A1] \cdot [x1]+[A2] \cdot [x2]+ \ldots +[An][xn]+[B][u] \quad \text{(equation 1)}$$

where [x0] is the current state, {[x1], [x2], ... [xn]} are the previous 'n' states, and {[A1], [A2] ... [An]} are the prediction step matrices for each derivative.

An approximation and practical implementation of this modeling is to increase the use of the dynamical system representation beyond the previous state only. These models can reflect better the non-linearity inherently part of the underlying physical sub-systems. In addition, there can be external influences that affect the prediction. This is represented in the above question by corresponding control state vector [u] and control matrix [B], respectively.

By way of explicit example, consider a vehicle dynamics sub-system. In this sub-system, there may be four state variables: time (t), velocity (v), acceleration (a), and distance/displacement (d), that describe the dynamics of the vehicle. Note that not all of these physical characteristics may be measured directly in the vehicle. For example, it may very well be that the vehicle itself is not equipped with an accelerometer that directly measures the acceleration of the vehicle. Underlying these state variables may be a physical model that describes the physical relationships between these characteristics. Notably, these characteristics may be related according to the following physical dynamics equation:

$$d = \tfrac{1}{2}at^2 + vt \quad \text{(equation 2)}$$

To build a behavioral model from this physical model, a state vector can be constructed as follows:

$$x_i = [tvad]T \quad \text{(equation 3)}$$

Using this state vector in equation 1 above and based on the physical relationship between the characteristics, first and second order state matrices, $A_0$ and $A_1$, respectively, can be constructed as follows:

$$A_1 = \begin{bmatrix} 1 & 0 & 0 & 0 \\ 0 & \alpha & dt & 0 \\ 0 & \frac{1}{dt} & 0 & 0 \\ 0 & dt & \frac{1}{2}dt^2 & \alpha \end{bmatrix} \quad \text{(equation 4)}$$

$$A_2 = \begin{bmatrix} 0 & 0 & 0 & 0 \\ 0 & (1-\alpha) & 0 & 0 \\ 0 & -\frac{1}{dt} & 0 & 0 \\ 0 & 0 & 0 & (1-\alpha) \end{bmatrix} \quad \text{(equation 5)}$$

where the proportionality (∂) is an arbitrary number and the time differential (dt) is the time resolution between two states. The two state matrices, $A_0$ and $A_1$, are modeled in this sub-system to reflect the differential aspect of the quadratic nature of the dynamic physical equation 2 above. The system models the differential state for both matrices, evaluating the acceleration instantaneously rather than depending on the acceleration variable reflected in the state vector.

In the absence of an explicit model, according to various embodiments, the default super resolution system will approximate a generic linear model. Such approximations will reduce the correlation factors. The approximate takes on a differential equation model, computing dx/dt from the state matrices or as a pair variable:

$$[x_0] = [1/dt0; dt1] \cdot [x_1] + [-1/dt0; 00] \cdot [x_2] \quad \text{(equation 6)}$$

where the first variable computes the derivative and the second compute the estimation over a period dt.

In contrast to standard linear systems, the above approach also allows for the effective modeling of non-linear systems. In particular, standard models are linear and rely on the previous state, which is a linear interpolation limitation. However, by increasing the differentiability of the state equation to two or more prior states (e.g., by modeling two or more previous states), this leads to a higher fidelity in the interpolation and the extrapolation of the inherent non-linearity of the sub-systems.

While considering additional prior states in the model will improve the fidelity of the prediction, it will not make it non-linear. For example, the model $X_0=X_1+X_2+X_3$ is still linear and cannot be referred to as non-linear. In contrast, a non-linear system is possible by just having one prior state such as $X_0=X_1^2+X_1+2$. By increasing the prior states, the evaluation of a non-linear system reflects the correct time rather than having to have lag in the state. Lag of a state is defined as the number of historical data used in the prediction. Therefore, more states imply more lag. However, the opposite is actually true.

In some embodiments, the above techniques can be extended to non-linear systems with higher order, non-linear complexity by using an expansion method, such as the Euler expansion method. Using such a method, an exponential model can be broken down into a quadratic representation. If a model is represented by a non-linear function that is differentiable, then such functions can be represented as Taylor series or likewise, so that a linear approximation of the non-liner model can be achieved. This can be solved using extended Kalman filtering techniques, in some embodiments. However, Euler expansion results in representing an exponential as a complex quadratic equation and not a quadratic one.

Further, any linear transformations, such as Fourier transforms or inverse Fourier transforms, can be performed inline as state calculations where the state matrix model is integrated over the time series states. An example of this would be the RPM of the engine where the underlying time series data is the angle of axial rotations from a reference point. Another example of this would be the inertia sensor (acceleration) of the vehicle where the underlying time series data is the vehicle inertia of the vehicle in three dimensions from a reference point. Extending this where the limited window for such transformations are performed with specific integral state matrix models whereas these integrals are performed over time series, the oldest transformed vector can be subtracted directly (differential) from the already transformed states.

Independent Sparse Sub-System Calculations for Dynamic State Estimation in Embedded Systems The techniques herein introduce a sparse computational approach for updating vehicle sub-system states in a behavioral model for the vehicle, thus significantly reducing resource requirements in terms of both CPU and memory. Notably, machine learning-based behavioral models that predict the physical states of a vehicle may be very computationally intensive. When such models are also based on variables from different vehicle sub-systems/sub-networks (e.g., an engine CANBUS, a GPS CANBUS, etc.), from which variable updates may occur at different times, it may not be possible to fully update the behavioral model at each pass, due to a lack of computational resources available in the vehicle.

Operationally, modeling complex state variables for multiple sub-systems of an embedded system, such as a vehicle, may entail processing parameter variables that can number into the thousands. For example, most modern automotive vehicles now have over 300 physical sensors. Adding the un-measured, derived, or other states to the state vector for the vehicle will grow the state vector to be very large. As noted above, mathematical, physical, and behavioral models for these sub-systems can be developed to predict the behavior of the systems over time. All sub-systems are then represented by a set of state variables. The model predicts the current state based on the n-th order derivative of previous states.

For embedded systems, such as a vehicle ECU or other processor, it may be prohibitive to perform large computations, including full updates to a behavioral model for the vehicle. For example, if the state count is in the order of 1,000, each state matrix needed would be 1,000 squared. For a double precision implementation, the memory requirements will grow exponentially. Computational complexity will also follow at an exponential rate. This is not scalable using the hardware available today.

In general, the techniques disclosed herein allow for the performance of such complex model updates in a much more efficient way, both for memory usage, as well as CPU usage. These techniques reduce the computational complexity almost to be of the order of the number of states times the required floating-point precision.

As noted above, physical states of a vehicle are modeled and represented as a state numerical vector in a vector matrix form for the said variables, with dimension representing the states of interests. Inserting the state vector in an enhanced dynamical system recursion takes the following general format whereby '0th' represents the current state, '1th' represents the previous state, etc.

$$[x_0]=[A_1]\cdot[x_1]+[A_2]\cdot[x_2]+ \ldots +[A_n][x_n]+[B][u] \quad \text{(equation 7)}$$

where, $[x_0]$ is the current state, $\{[x_1], [x_2], \ldots, [x_n]\}$ are the previous 'n' states, and $\{[A_1], [A_2], \ldots, [A_n]\}$ are the prediction step matrices for each derivative.

A vehicle system is indeed a system of systems or sub-systems. This subdivision is dependent on the underlying physics or behavior model. For example, the state variables for a vehicle GPS system are longitude, latitude, elevation and distance. It can be assumed that longitude, latitude, and elevation are derived variables from the GPS sub-system, yet another derived variable, the distance 'd,' can be derived as a variable from the axial rotation sensors of the vehicle (e.g., the vehicle dynamics sub-system). For example, the distance variable used in the model may be obtained from odometer sensor readings in the vehicle. In this example, a GPS sub-systems relates only on a subset of the whole vehicle states (e.g., the distance 'd' covered by the vehicle, in addition to the longitude, latitude, and elevation state variables. The choice of this example is also to reflect the update frequency of a GPS system being difference from the CANBUS updating the odometer readings. For the sake of this illustration, assume that the CANBUS updates at 100 ms and a GPS sub-system updates at a different frequency based on an arbitrary variance.

According to various embodiments, the processor of the vehicle or other embedded system may compute the sub-system in the overall system according to the following pseudocode:

Create state $\{[x_1], [x_2], \ldots [x_n]\}$ in the Memory Heap (static)

Create a data model index [index] in the Memory Heap mapping variables location in [x]

Call-Back Sub-System

Find in [Index] reference to sub-system minimum viable state variables

Extract local references into [x] in matrices [xx]
Lock memory used by [xx]
Compute $[xx_0]=[A_1]\cdot[xx_1]+[A_2]\cdot[xx_2]+\ldots+[A_n][xx_1]+[B][u]$
(Note: Updating $[xx_0]$ is updating $[x_0]$ directly since xx is reference indexed into x)
Unlock memory used by [xx]
End loop;

The processor can also take a similar approach with respect to other variables such as variance updates and calculations, in a sparse fashion. For example, in some embodiments, covariance updates, matrices transpositions, and matrix inversions may be performed in a similar manner as above. Consider the case of a Kalman Filter gain implementation as follows:

$$K=[P]\cdot[H]^T([H]\cdot[P]\cdot[H]^T)^{-1} \qquad \text{(equation 8)}$$

where K is the Kalman gain, P is the covariance matrix, and [H] is another design (besides A) matrix both of the dimensional of [x] square. This has a large computational complexity. The complexity is thus to compute the transpose, multiply two square matrices and invert another.

Leveraging the above sparse computation techniques above, updates to equation 8 can be performed by building a new, reduced matrix comprising of the relevant variable such as $$HH=[H_1,0\ldots;0,H_2,0\ldots,0\ldots,0,H_n] \qquad \text{(equation 9)}$$

where n is limited to the relevant states. For the GPS and Odometer example, this can be reduced to a 4×4 size matrix. P is also reduced to PP accordingly, all based on the maintained index. Thus, to compute the following sub-system in the overall system, the method is as follow:

Create state $\{[x1], [x2], \ldots [xn]\}$ in the Memory Heap (static)
Create a data model index [index] in the Memory Heap mapping variables location in [x]
Call-Back Sub-System
Find in [Index] reference to sub-system minimum viable state variables
Extract local references into [x] in matrices [xx]
Build a temporarily matrix [HH] and [PP]
Lock memory used by [xx]
Compute
Unlock memory used by [xx]
End loop;

As would be appreciated, the sparse computational approach introduced herein allows for updating of only a portion of the model at any given time, thereby accounting for different update frequencies of state variables from the different sub-systems. For example, in a typical vehicle, odometer updates occur more often than for GPS. Although the odometer updates only update a small percentage of the overall state variables, the model itself can still be updated by breaking the computations down to the level of minimum viable computation. A GPS update will also update the states of the model in similar fashion.

In other words, at any instant, the system is never updated all at once, only requiring the consumption of a small amount of memory. The process of sparse calculation leveraging time slicing the updates allows for the translation of the computation complexity into a managed process. In a practical sense, the number of variables (states) being updated at once is often less than 2% compared to the overall state vector dimension. The complexity reduction is thus reduced from quadratic to a quasi linear.

Said differently, different sub-systems/networks often broadcast variable updates at different rates. For example, an odometer on a CANBUS sub-system can update the relevant state sparsely in term of location and time frequency. Similarly, a GPS sub-system can update the system sparsely also in term of memory and time frequency. Doing so avoids having to update and re-compute the overall model at each pass. For example, memory locking an a deterministic clock can be used to establish a first-come, first-served strategy for model updates.

Note that it is also not a requirement that the model be updated at the same rate as the state variables. In one embodiment, an optional mechanism may be used to control which state variables are updated and when, such as by throttling or even turning off certain updates. For example, such a mechanism can be used to throttle down the sampling rate of CANBUS or other inputs, so as to intentionally reduce requests for certain updates while keeping others at full speed. A priority ordering on the updates can also be used, with the option of arbitrarily and completely disregarding others.

Since the state is a reflection of multiple inputs, the resulting update frequency of the state estimation is thus faster when the input clock are inherently independent for sub-systems, such as CANBUS and GPS. In addition, the techniques herein can be used to independently achieve sparse state updates in terms of dimensionality and frequency and without the need to perform a full state estimation computation.

As noted above, the super resolution techniques herein allow for greater reporting of telemetry data from a vehicle through the use of state predictions from a behavioral model of the vehicle. However, greater telemetry reporting also increases the potential threat to the network of the vehicle from malicious actors. For example, malware or even an unauthorized physical node on the network of the vehicle could potentially affect the operation of a component of the vehicle, report false sensor readings, or the like.

Vehicle Network Intrusion Detection System (IDS) Using Vehicle State Estimations The techniques herein provide for the modeling of vehicle states that can be leveraged for purposes of intrusion detection on the network of the vehicle. In some aspects, if the actual measurements on the network of the vehicle differ from the modeled behavior by a threshold amount, this may indicate a potential malicious intrusion of the network. In turn, the intrusion detection system (IDS) of the vehicle can initiate a mitigation action, such as alerting the driver as to the intrusion, etc.

Specifically, according to one or more embodiments of the disclosure as described in detail below, a processor of a vehicle predicts a state of the vehicle using a behavioral model. The model is configured to predict the state based in part on one or more state variables that are available from one or more sub-systems of the vehicle and indicative of one or more physical characteristics of the vehicle. The processor computes a representation of a difference between the predicted state of the vehicle and a measured state of the vehicle indicated by one or more state variables available from the one or more sub-systems of the vehicle. The processor detects a malicious intrusion of the vehicle based on the computed representation of the difference between the predicted and measured states of the vehicle exceeding a defined threshold. The processor initiates performance of a mitigation action for the detected intrusion, in response to detecting the malicious intrusion of the vehicle.

Illustratively, the techniques described herein may be performed by hardware, software, and/or firmware, such as in accordance with the vehicle super resolution process 248, which may include computer executable instructions executed by the processor 220 (or independent processor of interfaces 210) to perform functions relating to the techniques described herein.

Figure 6:
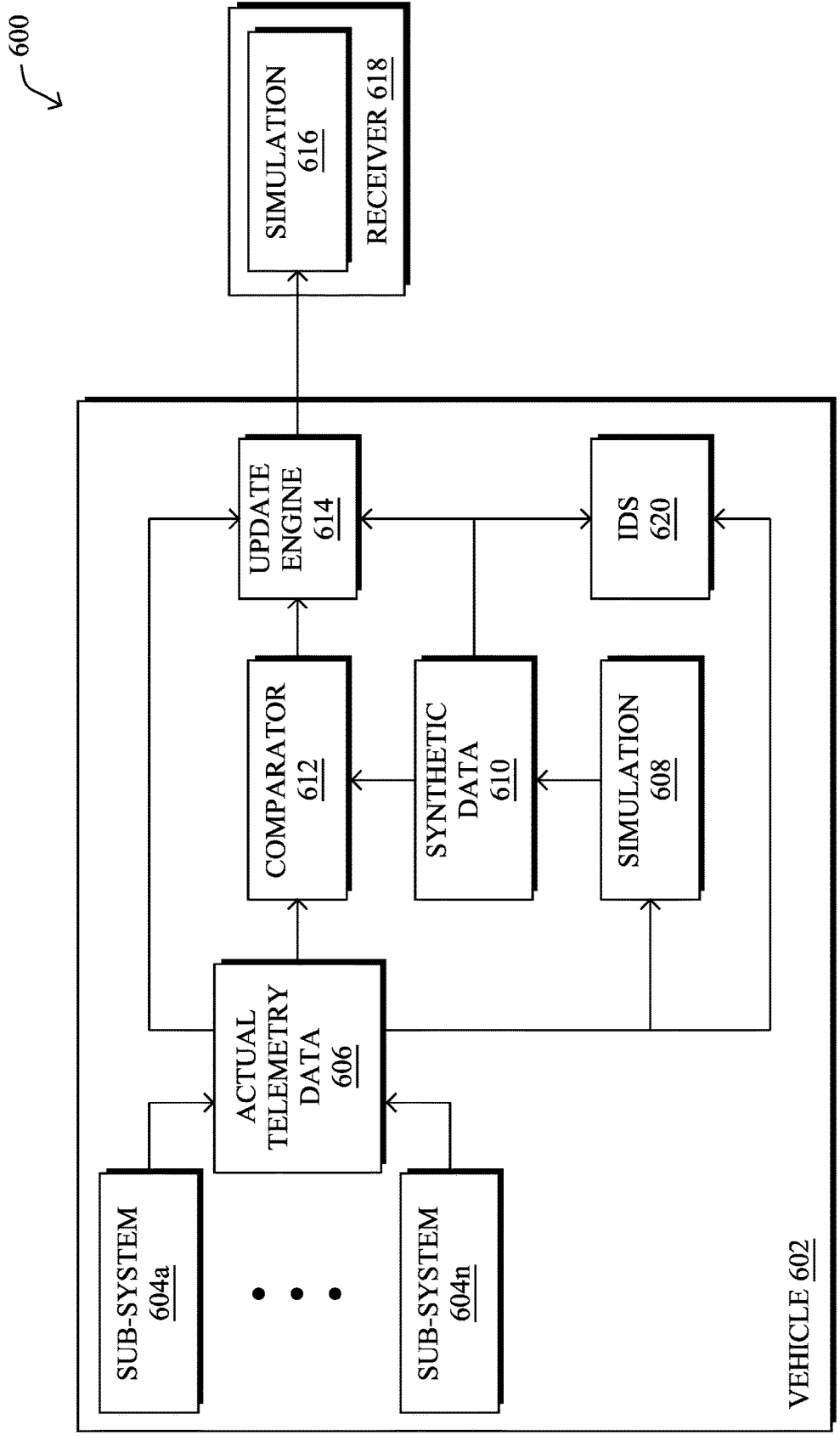
FIG. 6 illustrates an example architecture for performing intrusion detection in a vehicle.

Operationally, FIG. 6 illustrates an example architecture for performing intrusion detection in a vehicle, according to various embodiments. As shown in architecture 600, a vehicle 602 may send data indicative of its physical characteristics to a receiver 618 (e.g., for consumption by an application of the receiver). In various embodiments, vehicle 602 and receiver 618 may run simulation 610 and simulation 616, respectively, to model the behavior of the vehicle. Doing so provides for the reporting of the states of vehicle 602 to receiver 618 with super resolution and without requiring transmittal of all of the telemetry data generated by vehicle 602.

As detailed above, vehicle 602 may include any number of sub-systems 604 (e.g., a first through $n^{th}$ sub-system) that each collects and provides actual telemetry data 606 indicative of the physical characteristics of vehicle 602. For example, sub-systems 604 may each include any number of sensors, processors, or the like, that generate data indicative of the physical characteristics of vehicle 602. In addition, sub-systems 604 may each comprise their own sub-network to convey their generated data within vehicle 602. For example, sub-system 604a may include one CANBUS-based sub-network that conveys odometer readings, while sub-system 604n may be a separate CANBUS-based sub-network, IP network, GPS sub-system, or the like. As would be appreciated, the update frequency for telemetry data 606 may vary, depending on the reporting sensor and its associated sub-network.

Using telemetry data 604 with simulation 608, vehicle 602 is able to generate synthetic data 610 that predicts the physical characteristics and, thus, the current state, of vehicle 602. In a similar manner, simulation 616 at receiver 618 may also predict the state of vehicle 602 using these predictions as input to its application(s). As noted, simulations 608 and simulation 616 may work in conjunction with one another, with vehicle 602 sending updates to simulation 616.

For illustration purposes, one can imagine a vehicle 602 implementing the techniques herein on embedded hardware running in vehicle 602 and accepting actual telemetry 606 from sub-systems 604. The first step is to simulate the vehicle sub-systems 604 via simulation 608 with input from CANBUS, for example, as the true measurement. In turn, a comparator 612 is able to compute the difference between what the state produces as synthetic data 610 and actual telemetry data 606.

The second step is to process the difference between synthetic data 610 and the actual telemetry data 606. For example, comparator 612 may calculate the difference as an error variance using Bayesian statistics between synthetic data 610 and the actual telemetry data 606.

The third step, as shown in FIG. 6, entails update engine 614 employing decision criteria to determine whether the difference computed by comparator 612 between synthetic data 610 and actual telemetry data 606. For example, if the error variance computed by comparator 612 is above a defined threshold (e.g., the difference is statistically significant), update engine 614 may determine that the diverging telemetry data 606 should be sent to receiver 618 as an update.

According to various embodiments, vehicle 602 may also include an intrusion detection system (IDS) 620 configured to detect potential malicious intrusions of the network of vehicle 602. As noted above, architecture 600 may compute and evaluate, at any time, the difference between what the state produces as synthetic data 610 and the actual telemetry data 606 (e.g., measurement data from vehicle 602). In turn, comparator 612 may evaluate the difference between synthetic data 610 and actual telemetry data 606, to provide updates to simulation 616. In various embodiments, IDS 620 may leverage this comparison to determine whether a representation of the difference between the actual telemetry data 606 and the synthetic data 610 exceeds a given variance threshold. If so, this may indicate the presence of a malicious intrusion of the system. As would be appreciated, IDS 620 may be implemented as a stand-alone module or its functions may be integrated into one or more of the other components shown, such as comparator 612.

Said differently, the error between the predicted state (e.g., synthetic data 610) and the actual state of the vehicle (e.g., as indicated by actual telemetry data 606) may itself indicate whether a malicious intrusion exists in the network of vehicle 602. For example, consider the case in which simulation 608 predicts an odometer value for vehicle 602 based in part on a velocity of vehicle 602. Notably, the velocity state variable, which may be available from one of sub-systems 604, can be integrated as part of simulation 608, to obtain a predicted odometer reading for vehicle 602. However, if this prediction differs from an actual odometer reading value (e.g., in telemetry data 606) by a threshold amount, IDS 620 may flag such a condition as indicative of a malicious intrusion.

In various embodiments, IDS 620 within vehicle 602 may detect an intrusion as follows:

1.) Simulation 608 simulates sub-system(s) 604 to form state estimates/predictions of the sub-systems as synthetic data 610.

2.) Next, simulation 608 may also compute the correlations among the predicted states. This can be represented by covariance elements (e.g., to populate a covariance matrix associated with the predicted state).

3.) IDS 620 then determines the difference between the actual measurements (e.g., actual telemetry data 606) and the estimated states (e.g., in synthetic data 610) and analyzes the difference against the Kalman gain for simulation 608.

4.) IDS 620 may then compute the Kalman gain to measurement (e.g., adjustment ratio) as the covariance of the estimate divided by the sum of all covariance as follows:

$$K=P(P-R)-1 \text{(where } 0<K<1) \qquad \text{(equation 10)}$$

$$[y]=K\cdot([x]-[u])\cdot[x]-1 \qquad \text{(equation 11)}$$

where T is an arbitrary threshold, [x] is the expected vector variable of vehicle dynamic states, [u] is the actual telemetry data indicative of the state, P is the predicted state covariance and R is the measurement covariance. Note that R may be based on the known covariance error presented from the one or more sensors that provide the actual telemetry data indicative of the measurement state.

5.) IDS 620 may then detect a threat or other malicious intrusion if the following is true:

$$|[y]|>T \text{(where } 0<T<1) \qquad \text{(equation 12)}$$

In other words, the violation or threat(s) is when the percent correction [y] statistically exceeds the physical boundary for the computed part of the norm of the set models. Note also that white noise and/or jitter can be extracted out after computing [y].

Once IDS 620 has detected a malicious intrusion, it may take any number of mitigation actions. In one embodiment, IDS 620 may generate and send a notification to a display or other user interface of vehicle 602. For example, IDS 620 may provide data regarding the detected intrusion to a dashboard display or heads up display of vehicle 602. In other embodiment, IDS 620 may provide an indication of the detected intrusion to receiver 618 (e.g., to prevent receiver 618 from relying on the affected data). In further embodiments, IDS 620 may disable an affected component or initiate other network security measures, such as blocking traffic in the local network of vehicle 602, quarantining the traffic, or the like.

Figure 7:
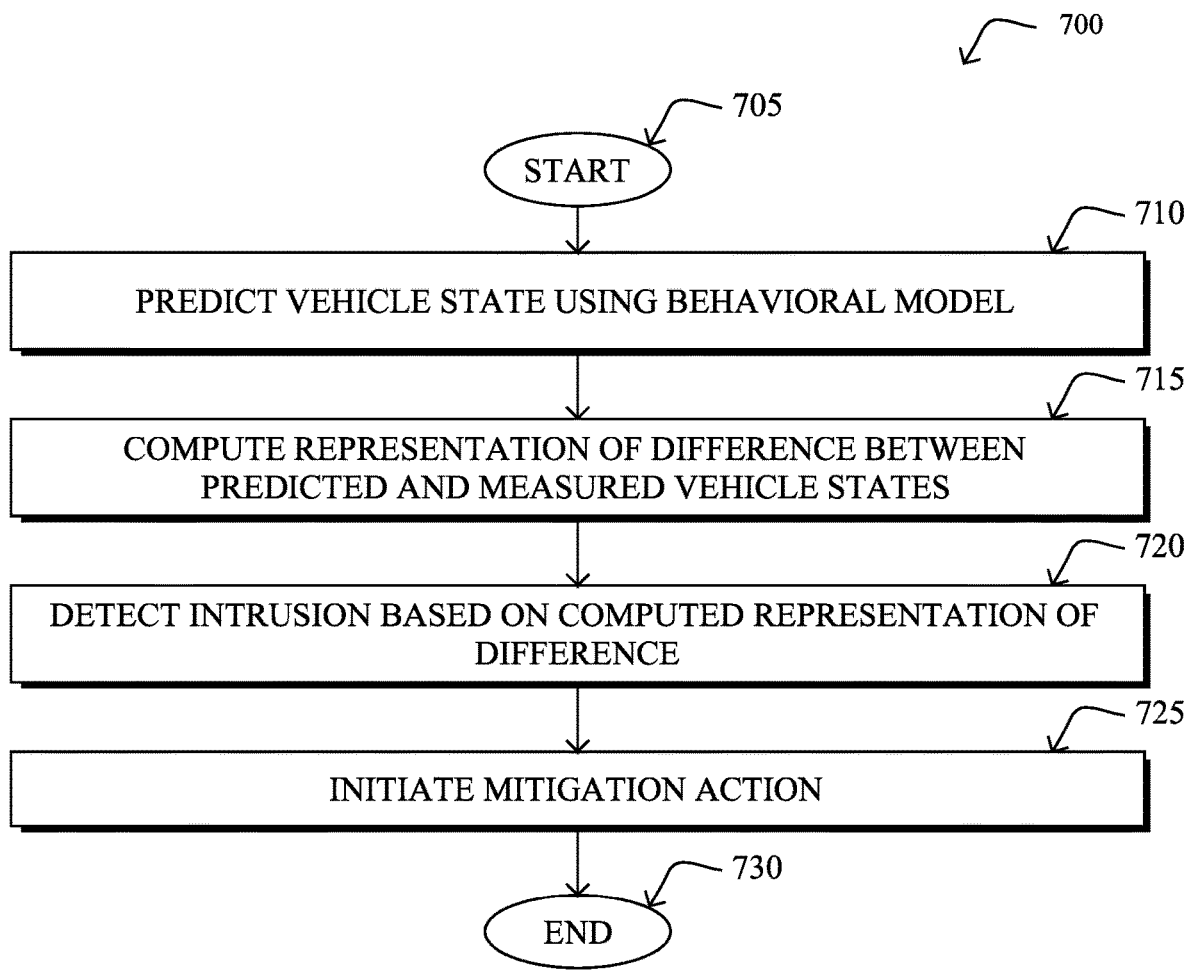
FIG. 7 illustrates an example simplified procedure for using vehicle state predictions to perform intrusion detection in a vehicle.

FIG. 7 illustrates an example simplified procedure for using vehicle state predictions to perform intrusion detection in a vehicle, in accordance with one or more embodiments described herein. For example, a processor of a non-generic, specifically configured device (e.g., device 200) in a vehicle may perform procedure 700 by executing stored instructions (e.g., process 248). The procedure 700 may start at step 705, and continues to step 710, where, as described in greater detail above, the processor may predict a state of the vehicle using a behavioral model. In various embodiments, the model is configured to predict the state of the vehicle based in part on one or more state variables that are available from one or more sub-systems of the vehicle and indicative of one or more physical characteristics of the vehicle. For example, certain state variables/measurements from a sub-system/CANBUS may be used to predict a physical state of the vehicle (e.g., the measured velocity of the vehicle can be used to predict an odometer reading, etc.).

At step 715, as detailed above, the processor may compute a representation of a difference between the predicted state of the vehicle and a measured state of the vehicle indicated by one or more state variables available from the one or more sub-systems of the vehicle. For example, if the behavioral model comprises a Kalman filter, the processor may represent the difference as the error associated with the filter. Such a difference may be computed, in some embodiments, according to equations 10-11 above.

At step 720, the processor may detect a malicious intrusion of the vehicle, as described in greater detail above. Generally, any statistically significant deviation between the predicted state and the state indicated by the measurement data may indicate that the network of the vehicle has been infiltrated maliciously. In some embodiments, this detection may be based on the computed representation of the difference between the predicted state of the vehicle and the measured state of the vehicle exceeding a defined threshold. For example, if the Kalman error correction for the behavioral model exceeds the threshold, the processor may determine that an intrusion exists.

At step 725, as detailed above, the processor may initiate a mitigation action, in response to detecting the malicious intrusion of the vehicle. In some embodiments, this may entail sending a notification of the detection to a user interface, such as a display of the vehicle. In further embodiments, the mitigation action may entail notifying an entity external to the vehicle, such as a cloud service, etc. Another mitigation action may block or quarantine the affected traffic on the network of the vehicle. Procedure 700 then ends at step 730.

t should be noted that while certain steps within procedure 700 may be optional as described above, the steps shown in FIG. 7 are merely examples for illustration, and certain other steps may be included or excluded as desired. Further, while a particular order of the steps is shown, this ordering is merely illustrative, and any suitable arrangement of the steps may be utilized without departing from the scope of the embodiments herein.

The techniques described herein, therefore, allow for the reporting of vehicle telemetry data, while consuming less resources of the external network. In addition, the techniques herein provide for an intrusion detection mechanism for the vehicle that is based in part on the predicted states of the vehicle.

While there have been shown and described illustrative embodiments that provide for a vehicle intrusion detection system (IDS), it is to be understood that various other adaptations and modifications may be made within the spirit and scope of the embodiments herein. For example, while the techniques herein are described primarily with respect to vehicles that include one or more CANBUS sub-systems, the techniques herein can also be adapted for use in manufacturing where the underlying protocol is MODBUS. In MODBUS, the underlying sensors reflect manufacturing processes, robotics, and other sensory and actuating found in the energy sector.

The foregoing description has been directed to specific embodiments. It will be apparent, however, that other variations and modifications may be made to the described embodiments, with the attainment of some or all of their advantages. For instance, it is expressly contemplated that the components and/or elements described herein can be implemented as software being stored on a tangible (non-transitory) computer-readable medium (e.g., disks/CDs/RAM/EEPROM/etc.) having program instructions executing on a computer, hardware, firmware, or a combination thereof. Accordingly, this description is to be taken only by way of example and not to otherwise limit the scope of the embodiments herein. Therefore, it is the object of the appended claims to cover all such variations and modifications as come within the true spirit and scope of the embodiments herein.

What is claimed is:

1. A method, comprising:

predicting, by a processor of a vehicle, a state of the vehicle using a behavioral model comprising a Kalman filter, wherein the model is configured to predict the state of the vehicle based in part on one or more state variables that are available from one or more sub-systems of the vehicle and indicative of one or more physical characteristics of the vehicle, wherein the one or more sub-systems update the one or more state variables at different rates, further wherein the predicting is based on only portions of the model being updated at a given time;

computing, by the processor, a representation of a difference between the predicted state of the vehicle and a measured state of the vehicle indicated by one or more state variables available from the one or more sub-systems of the vehicle by computing a Kalman gain for the behavioral model, wherein the Kalman gain is: a covariance associated with the predicted state divided by a sum of a) the covariance associated with the predicted state and b) a covariance associated with the measured state;

detecting, by the processor, a malicious intrusion of the vehicle based on the computed representation of the difference between the predicted state of the vehicle and the measured state of the vehicle exceeding a defined threshold; and initiating, by the processor, performance of a mitigation action for the detected intrusion, in response to detecting the malicious intrusion of the vehicle.

2. The method as in claim 1, wherein initiating performance of the mitigation action for the detected intrusion comprises:
providing, by the processor, a notification of the detected intrusion to a display of the vehicle.

3. The method as in claim 1, wherein at least one of the one or more sub-systems comprises a Controller Area Network (CAN) bus.

4. The method as in claim 1, wherein the one or more state variables used by the behavioral model to predict the state of the vehicle differ from the one or more state variables that indicate the measured state of the vehicle.

5. The method as in claim 1, wherein detecting the malicious intrusion comprises:
using the Kalman gain to compute a percent correction for the behavioral model as the representation of the difference between the predicted and measured states of the vehicle.

6. The method as in claim 1, wherein the threshold is between zero and one.

7. The method as in claim 1, wherein the predicted state comprises an odometer estimation, wherein the one or more state variables used by the behavioral model to predict the odometer estimation is indicative of a velocity of the vehicle, and wherein the one or more state variables indicative of the measured state of the vehicle comprises a measurement from an odometer of the vehicle.

8. An apparatus, comprising:
one or more network interfaces to communicate with a network of a vehicle;
a processor coupled to the network interfaces and configured to execute one or more processes; and
a memory configured to store a process executable by the processor, the process when executed configured to:
predict a state of the vehicle using a behavioral model comprising a Kalman filter, wherein the model is configured to predict the state of the vehicle based in part on one or more state variables that are available from one or more sub-systems of the vehicle and indicative of one or more physical characteristics of the vehicle, wherein the one or more sub-systems update the one or more state variables at different rates, further wherein the predicting is based on only portions of the model being updated at a given time;
compute representation of a difference between the predicted state of the vehicle and a measured state of the vehicle indicated by one or more state variables available from the one or more sub-systems of the vehicle by computing a Kalman gain for the behavioral model, wherein the Kalman gain is: a covariance associated with the predicted state divided by a sum of a) the covariance associated with the predicted state and b) a covariance associated with the measured state;
detect malicious intrusion of the vehicle based on the computed representation of the difference between the predicted state of the vehicle and the measured state of the vehicle exceeding a defined threshold; and
initiate performance of a mitigation action for the detected intrusion, in response to detecting the malicious intrusion of the vehicle.

9. The apparatus as in claim 8, wherein the apparatus initiates performance of the mitigation action for the detected intrusion by:
providing a notification of the detected intrusion to a display of the vehicle.

10. The apparatus as in claim 8, wherein at least one of the one or more sub-systems comprises a Controller Area Network (CAN) bus.

11. The apparatus as in claim 8, wherein the one or more state variables used by the behavioral model to predict the state of the vehicle differ from the one or more state variables that indicate the measured state of the vehicle.

12. The apparatus as in claim 8, wherein the apparatus detects the malicious intrusion by:
using the Kalman gain to compute a percent correction for the behavioral model as the representation of the difference between the predicted and measured states of the vehicle.

13. The apparatus as in claim 8, wherein the threshold is between zero and one.

14. The apparatus as in claim 8, wherein the predicted state comprises an odometer estimation, wherein the one or more state variables used by the behavioral model to predict the odometer estimation is indicative of a velocity of the vehicle, and wherein the one or more state variables indicative of the measured state of the vehicle comprises a measurement from an odometer of the vehicle.

15. A tangible, non-transitory, computer-readable medium storing program instructions that cause a processor of a vehicle to execute a process comprising:
predicting, by the processor of the vehicle, a state of the vehicle using a behavioral model comprising a Kalman filter, wherein the model is configured to predict the state of the vehicle based in part on one or more state variables that are available from one or more sub-systems of the vehicle and indicative of one or more physical characteristics of the vehicle, wherein the one or more sub-systems update the one or more state variables at different rates, further wherein the predicting is based on only portions of the model being updated at a given time;
computing, by the processor, a representation of a difference between the predicted state of the vehicle and a measured state of the vehicle indicated by one or more state variables available from the one or more sub-systems of the vehicle by computing a Kalman gain for the behavioral model, wherein the Kalman gain is: a covariance associated with the predicted state divided by a sum of a) the covariance associated with the predicted state and b) a covariance associated with the measured state;
detecting, by the processor, a malicious intrusion of the vehicle based on the computed representation of the difference between the predicted state of the vehicle and the measured state of the vehicle exceeding a defined threshold; and
initiating, by the processor, performance of a mitigation action for the detected intrusion, in response to detecting the malicious intrusion of the vehicle.

16. The computer-readable medium as in claim 15, wherein initiating performance of the mitigation action for the detected intrusion comprises:
providing, by the processor, a notification of the detected intrusion to a display of the vehicle.

17. The computer-readable medium as in claim 15, wherein at least one of the one or more sub-systems comprises a Controller Area Network (CAN) bus.

18. The computer-readable medium as in claim 15, wherein detecting the malicious intrusion comprises:
   using the Kalman gain to compute a percent correction for the behavioral model as the representation of the difference between the predicted and measured states of the vehicle.

\* \* \* \* \*

UNITED STATES PATENT AND TRADEMARK OFFICE
CERTIFICATE OF CORRECTION

PATENT NO. : 11,110,895 B2
APPLICATION NO. : 15/948134
DATED : September 7, 2021
INVENTOR(S) : David A. Maluf et al.

It is certified that error appears in the above-identified patent and that said Letters Patent is hereby corrected as shown below:

In the Specification

Column 12, Line 25, please amend as shown:
$d = \frac{1}{2}at^2 + vt$ (equation 2)

Column 15, Line 3, please amend as shown:
Compute $[xx_0] = [A_1].[xx_1] + [A_2].[xx_2] + ... + [A_n][xx_n] +$ Signed and Sealed this
Twenty-first Day of December, 2021

Drew Hirshfeld
*Performing the Functions and Duties of the*
*Under Secretary of Commerce for Intellectual Property and*
*Director of the United States Patent and Trademark Office*